(12) United States Patent
Gris

(10) Patent No.: US 6,319,786 B1
(45) Date of Patent: Nov. 20, 2001

(54) SELF-ALIGNED BIPOLAR TRANSISTOR MANUFACTURING METHOD

(75) Inventor: Yvon Gris, Tullins (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/588,426

(22) Filed: Jun. 6, 2000

(30) Foreign Application Priority Data

Jun. 18, 1999 (FR) .................................................. 99 07978

(51) Int. Cl.⁷ .................................................. H01L 21/331
(52) U.S. Cl. .................... 438/341; 438/481; 438/368; 438/350
(58) Field of Search .................... 438/309, 341, 438/365, 366, 367, 368, 481, 350

(56) References Cited

U.S. PATENT DOCUMENTS

| | | |
|---|---|---|
| 4,916,083 * | 4/1990 | Monkowski et al. . |
| 5,008,207 * | 4/1991 | Blouse et al. . |
| 5,137,840 | 8/1992 | Desilets et al. . |
| 5,523,245 | 6/1996 | Imai . |
| 5,541,124 * | 7/1996 | Miwa et al. . |
| 5,643,805 * | 7/1997 | Ohta et al. . |

OTHER PUBLICATIONS

French Search Report from French Patent Application 99 07978, filed Jun. 18, 1999.

* cited by examiner

*Primary Examiner*—Tuan H. Nguyen
(74) *Attorney, Agent, or Firm*—Wolf, Greenfield & Sacks, P.C.; James H. Morris

(57) ABSTRACT

The manufacturing of a bipolar transistor, including the steps of depositing a P-type polysilicon layer and an insulating layer on an N-type substrate; defining in said layers a base-emitter opening; performing a P-type doping and annealing to form a heavily-doped region partially extending under the periphery of the polysilicon layer; forming a spacer in an insulating material inside the opening; isotropically etching the silicon across a thickness greater than that of the heavily-doped region to form a recess; conformally forming by selective epitaxy a P-type silicon layer to form the transistor base layer; and depositing N-type heavily-doped polysilicon to form the transistor emitter.

6 Claims, 2 Drawing Sheets

SELF-ALIGNED BIPOLAR TRANSISTOR MANUFACTURING METHOD

BACKGROUND OF THE INVENTION

1. Field of the Invention

The present invention generally relates to the manufacturing of bipolar devices. It applies to the manufacturing of bipolar transistors in pure bipolar technology or in mixed bipolar-CMOS (BICMOS) technology.

2. Discussion of the Related Art

Manufacturing the base-emitter junctions of bipolar transistors raises different problems. It is in particular desirable to have self-aligned manufacturing processes to reduce the dimensions of the devices.

It is also desirable not to implant the base, which inevitably creates gaussian doping profiles. The base is ideally formed by a doped epitaxial deposition.

It is also desirable to minimize the access resistance to the base (base resistance) and to improve the frequency response of the transistors. For this purpose, it has in particular been provided to use a silicon-germanium layer as a base. However, the use of germanium, although considerably improving the access resistance of a bipolar transistor and the transit time through the base, raises implementation problems. It is difficult to bring this germanium, by an implantation, into a silicon layer, and such a layer does not withstand high temperatures (the temperature must remain stable under 900° C.; a fast thermal anneal no more constraining than 1030° C. may however be tolerated for 20 s).

SUMMARY OF THE INVENTION

An object of the present invention thus is to provide a novel method of manufacturing bipolar transistors enabling formation of base-emitter junctions in a self-aligned way.

Another object of the present invention is to provide such a method reducing or minimizing the base resistance of the transistors.

Another object of the present invention is to provide such a method that is compatible with the use of a silicon-germanium base region.

To achieve these and other objects, the present invention provides a method of manufacturing a bipolar transistor, including the steps of defining an active area in the surface of a silicon layer of a first conductivity type; depositing a doped polysilicon layer of the second conductivity type and an insulating layer; defining in said layers a base-emitter opening; performing a doping of the second conductivity type and annealing to form a heavily-doped region partially extending under the periphery of the polysilicon layer; forming a spacer in an insulating material inside the opening; isotropically etching the silicon across a thickness greater than that of the heavily-doped region to form a recess; conformally forming by selective epitaxy a silicon layer of the second conductivity type to form the transistor base layer; and depositing heavily-doped polysilicon of the first conductivity type to form the transistor emitter.

According to an embodiment of the present invention, the layer deposited by epitaxy contains germanium over at least a portion of its thickness.

According to an embodiment of the present invention, the spacer is a silicon nitride and silicon oxide spacer.

According to an embodiment of the present invention, the isotropic etching step is followed by a step of deep implantation of a dopant of the first conductivity type to form a buried collector area.

According to an embodiment of the present invention, the method further includes, after the step of conformal deposition by epitaxy, the step of forming a second spacer inside a first spacer.

According to an embodiment of the present invention, the doping level of said heavily-doped region is greater than $10^{19}$ at./cm$^3$.

The foregoing objects, features and advantages of the present invention, will be discussed in detail in the following non-limiting description of specific embodiments in connection with the accompanying drawings.

DETAILED DESCRIPTION

For clarity, the same elements have been designated by the same references in the different drawings. Further, as usual in the representation of integrated circuits, the various drawings are not to scale.

Figure 1:
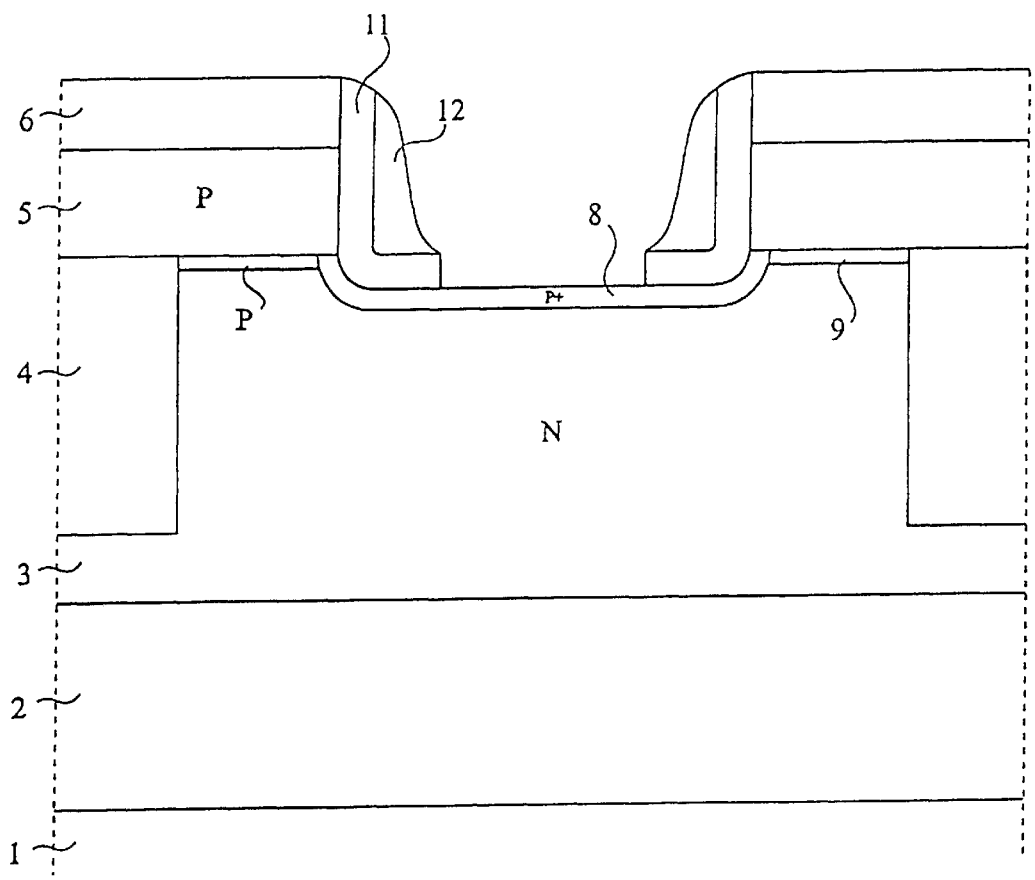
FIGS. 1 to 3 are partial simplified cross-section views of a bipolar transistor at different steps of an example of implementation of a manufacturing method according to an embodiment of the present invention.

FIG. 1 shows the state of a silicon substrate 1 of a first conductivity type, for example, type P, after initial steps of a method according to an embodiment of the present invention. The substrate includes, on the side of its upper surface, regions 2 and 3 of the second conductivity type, for example, N, respectively heavily and lightly doped. Region 2 results, for example, from an implantation/diffusion in substrate 1, and region 3 results from an epitaxial growth. Insulating regions, for example, trenches filled with a field insulation material 4 such as silicon oxide (SiO$_2$) define active areas in region 3. The assembly is covered with a heavily-doped P-type silicon layer 5, preferably, polysilicon. The doping is preferably performed by a boron implantation followed by a light anneal to obtain a shallow diffusion (9) into silicon 3. Layer 5 is covered with an insulating layer 6. Layers 6 and 5 are then opened to form an opening that exposes a substantially central region of active region 3 in which a bipolar transistor is to be formed.

The etching of layers 6 and 5 to form the above-mentioned opening causes a surface etching of silicon layer 3. This overetching has the advantage of ensuring a surface cleaning of layer 3 and of eliminating possible pollutions. A high dose implantation of a P-type dopant is then performed, for example, at a dose from $5.10^{14}$ to $2.10^{15}$ atoms/cm$^2$ under an energy from 5 to 10 keV. A P+-type region 8 that extends under the opening and under the internal periphery of P-type doped silicon layer 5 is thus obtained.

Then, a spacer made of an insulating material is formed inside the opening formed in layers 6 and 5. In the shown example of embodiment, the spacer is formed from successive silicon nitride and silicon oxide layers 11 and 12. This spacer is formed according to conventional techniques by deposition of layers 11 and 12 and anisotropic etching.

Figure 2:
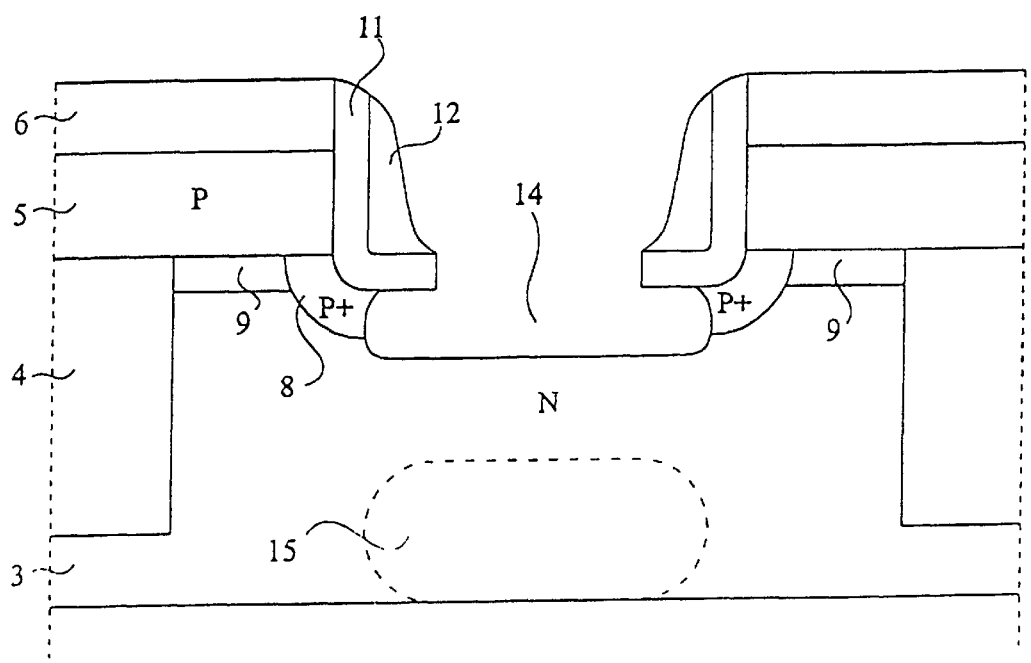

FIG. 2 illustrates the structure according to the present invention after selectively and isotropically etching the silicon. As shown in FIG. 2, this etching is continued until the portion of P+-type doped region 8 located inside the opening defined by spacer 11, 12 is completely removed. To be sure to completely remove region 8, the etching is carried on until etching a portion of epitaxial layer 3. A recess 14 that, due to the fact that the etching is isotropic, partially extends under the internal periphery of spacer 11, 12, is obtained. To perform the isotropic etching, an etching by an SF$_6$ and NF$_3$ plasma may be used in conditions adapted to simultaneously obtain an isotropic etching and a good selectivity of the silicon etching with respect to the SiO$_2$ and Si$_3$N$_4$ etching. It should be noted that a very heavily P+-type doped peripheral ring of region 8 remains in contact with heavily-doped P-type polysilicon region 5.

After forming recess 14, a high energy implantation (for example, at 200 keV) is preferably performed to form at the bottom of region 3, in contact with region 2, a heavily-doped N-type region 15 intended for forming the bottom of the collector of the bipolar transistor. The fact of performing this implantation after formation of the recess reduces the implantation energy and provides a buried collector well located under the base. Before implanting region 15, a thermal oxide that is then removed by wet etching is preferably grown. The forming of an ohmic contact with region 2 here is performed conventionally and is neither described nor shown herein.

A fast thermal anneal is then performed, which in particular diffuses the P dopant contained in the remaining portions of region 8 and ensures a good electric contact between the heavily-doped P-type polysilicon of layer 5 and of P regions 8 and 9.

Figure 3:
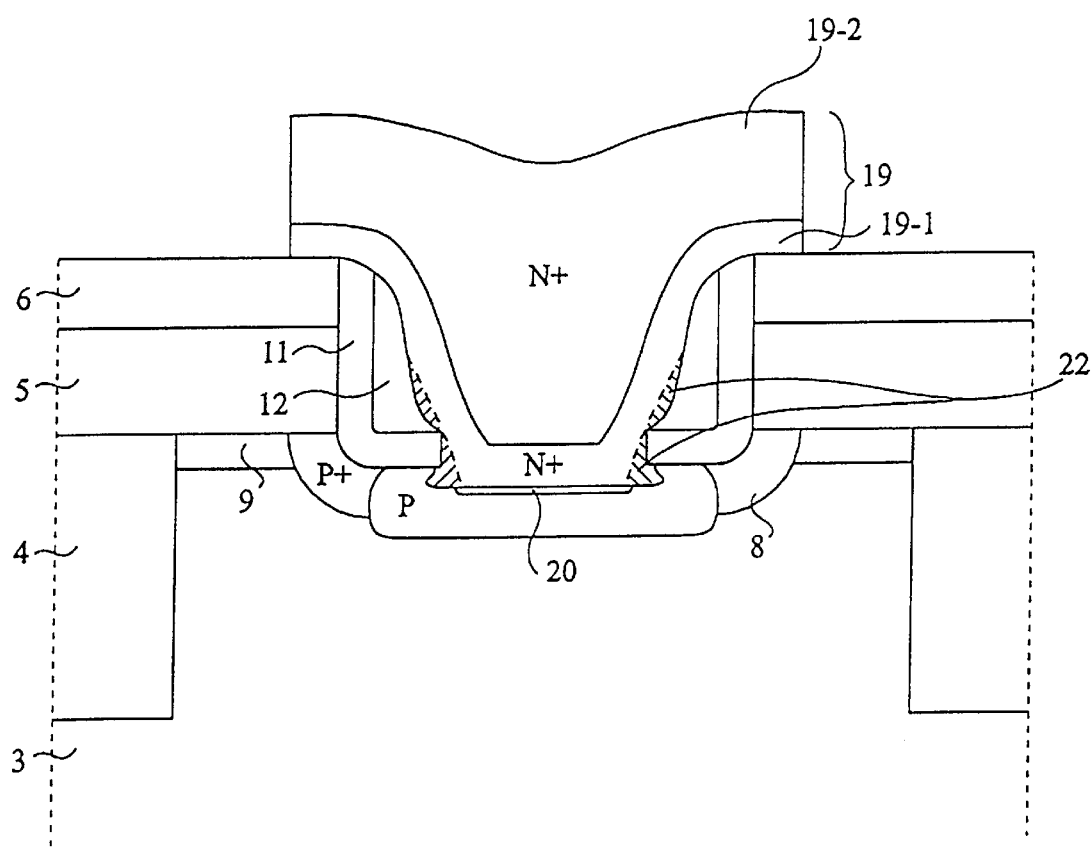

At the next steps, the result of which is illustrated in FIG. 3, a silicon layer 18 is grown to a thickness smaller than the depth of recess 14. Layer 18 is intended for forming the base of the bipolar transistor and is formed by a selective epitaxy method, to only develop from the silicon surfaces. All apparent silicon surfaces being single-crystal silicon, layer 18 will be single-crystal silicon. Layer 18 is doped by means of a P-type dopant, for example, boron at a concentration on the order of $5 \times 10^{18}$ atoms/cm$^3$.

To form the bipolar transistor emitter, an N-type polysilicon layer 19 heavily doped, for example, with arsenic, is deposited. Preferably, layer 19 is deposited in two steps. In a first step, a first polysilicon layer 19-1 is deposited with a particularly high doping level. A heavily but normally doped deposition of a second thicker polysilicon portion 19-2, for example at a doping level on the order of $10^{20}$ to $10^{21}$ atoms/cm$^3$, is then performed. The advantage of having a particularly doped underlayer is that a diffusion at low temperature of the N-type dopant into the surface portion 20 of base layer 18 is thus made easier.

Preferably, before depositing polysilicon layer 19, a spacer 22 in an insulating material is formed. Spacer 22 is intended for increasing the distance between the external periphery of emitter region 20 diffused into base 18 and the internal periphery of base contacting area 8 existing at the periphery of base region 18. The transistor characteristics, and especially its gain, are improved. Spacer 22 is formed by any known way and is for example made of silicon oxide.

The method ends conventionally by the etching of the useless portions of layer 19 and of layers 6 and 5, an encapsulation in silicon oxide, a fast thermal anneal for activating emitter region 20, and the forming of base and emitter contact areas. A contact with region 2 will also be tormed to torm a collector contact area, outside the shown plane.

The present invention especially applies to the forming of transistors having a silicon-germanium base. Indeed, in the step of epitaxial deposition of base layer 18 previously described in relation with FIG. 3, it is possible to provide that a portion at least of the thickness of layer 18 be made of a silicon-germanium alloy, according to a chosen concentration profile. The concentration profiles of germanium and of the dopant, for example boron, inserted in layer 18, are preferably such that their maximum concentration peaks inside layer 18 are distinct and that the germanium peak is closer to collector-base junction 3-18 than that of boron.

The method according to the present invention is well adapted to the forming of a silicon-germanium layer since it is possible to perform part of the anneals at high temperature before forming conformal epitaxial layer 18.

In an embodiment of the present invention, the characteristics of the various layers and etchings will be the following:

region 2:
  thickness: from 1 to 3 µm, preferably 2 µm;
  doping: $2 \times 10^{19}$ at./cm$^3$ of arsenic;
region 3 (formed by epitaxy):
  thickness: from 0.5 to 1 µm;
  doping: $1 \times 10^{16}$ at./cm$^3$ of arsenic;
P+-type region 8:
  from $10^{19}$ to $10^{20}$ at./cm$^3$ of boron; thickness of approximately 30 nm after implantation, from 50 to 150 nm, preferably on the order of 100 nm after anneal;
P-type doped base region 18:
  thickness: from 30 to 100 nm
  doping: from $5.10^{18}$ to $5.10^{19}$ at./cm$^3$ of boron;
spacer 11-12;
  layer 11 made of silicon nitride, of a thickness from 10 to 50 nm, preferably on the order of 30 nm.
  layer 12 is made of silicon oxide, of a thickness from 30 to 150 nm, preferably on the order of 80 nm.

Of course, the present invention is likely to have various alterations, modifications, and improvements which will readily occur to those skilled in the art. In particular, the principles of the present invention have been previously described and illustrated as applied to the forming of an NPN-type bipolar transistor. However, those skilled in the art should understand that a PNP-type transistor could be formed according to the same principles, by complementarily doping the different silicon regions, layer or portions. Those skilled in the art will also be able to adapt the described materials to a specific manufacturing line and to select the doping levels of the various semiconductive layers according tot he desired performances.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalent thereto.

What is claimed is:

1. A method for manufacturing a bipolar transistor, including the steps of:

defining an active area in a surface of a silicon layer of a first conductivity type;

depositing a polysilicon layer doped of a second conductivity type and an insulating layer;

defining in said layers a base-emitter opening;

doping according to the second conductivity type and annealing to form a heavily-doped region partially extending under a periphery of the polysilicon layer;

forming a spacer made of an insulating material inside the opening;

isotropically etching the silicon across a depth greater than that of the heavily-doped region to form a recess;

conformally forming, by selective epitaxy, a silicon layer of the second conductivity type to form the transistor base layer; and depositing polysilicon heavily-doped of the first conductivity type to form the transistor emitter.

2. The method of claim 1, wherein the layer deposited by epitaxy contains germanium over at least a portion of its thickness.

3. The method of claim 1, wherein the spacer is made of silicon nitride and silicon oxide.

4. The method of claim 1, wherein the isotropic etching step is followed by a step of deep implantation of a dopant of the first conductivity type to form a buried collector area.

5. The method of claim 1, further including, after the step of conformal deposition by epitaxy, the step of forming a second spacer inside a first spacer.

6. The method of claim 1, wherein the doping level of said heavily-doped region is greater than $10^{19}$ at./cm$^3$.

* * * * *

UNITED STATES PATENT AND TRADEMARK OFFICE
CERTIFICATE OF CORRECTION

PATENT NO.    : 6,319,786 B1
DATED         : November 20, 2001
INVENTOR(S)   : Yvon Gris Page 1 of 1

It is certified that error appears in the above-identified patent and that said Letters Patent is hereby corrected as shown below:

<u>Column 4,</u>
Line 44, should read -- according to the desired performances. --

Signed and Sealed this

Nineteenth Day of March, 2002

Attest:

JAMES E. ROGAN
*Director of the United States Patent and Trademark Office*

*Attesting Officer*